United States Patent
Naito et al.

(12) 
(10) Patent No.: US 6,175,582 B1
(45) Date of Patent: Jan. 16, 2001

(54) SEMICONDUCTOR LASER DEVICE

(75) Inventors: Yumi Naito; Yasuo Oeda; Tsuyoshi Fujimoto, all of Sodegaura (JP)

(73) Assignee: Mitsui Chemicals Inc., Tokyo (JP)

( * ) Notice: Under 35 U.S.C. 154(b), the term of this patent shall be extended for 0 days.

(21) Appl. No.: 09/199,435

(22) Filed: Nov. 25, 1998

(30) Foreign Application Priority Data

Nov. 26, 1997 (JP) .................................................. 9-324768

(51) Int. Cl.$^7$ ...................................................... H01S 5/00

(52) U.S. Cl. .............................................. 372/45; 372/46

(58) Field of Search ................................. 372/46, 45, 50; 438/40, 43; 257/94

(56) References Cited

U.S. PATENT DOCUMENTS

| | | | |
|---|---|---|---|
| 3,855,607 | * 12/1974 | Kressel et al. | 372/45 |
| 4,328,469 | * 5/1982 | Scifres et al. | 372/45 |
| 5,301,202 | * 4/1994 | Harder et al. | 372/46 |
| 5,764,668 | * 6/1998 | Ishizaka et al. | 372/45 |

FOREIGN PATENT DOCUMENTS

| | | |
|---|---|---|
| 2-113586 | 4/1990 | (JP) . |
| 7-231139 | 8/1995 | (JP) . |
| WO 9316513 | 8/1993 | (WO) . |

OTHER PUBLICATIONS

S. M. Sze, Physics and Technology, p. 36, 1985 (No Month Available).

G. P. Agrawal et al., Long–Wavelength Semiconductor Lasers, pp. 192–199, 1986 (No Month Available).

Ryoichi Ito and Michiharu Nakamura, "Gain of light and condition of laser oscillation", *Semiconductor Laser –basis and application–*, p. 85, Apr. 25, 1989.

* cited by examiner

*Primary Examiner*—Teresa M. Arroyo
*Assistant Examiner*—Quyen P. Leung
(74) *Attorney, Agent, or Firm*—Birch, Stewart, Kolasch & Birch, LLP

(57) ABSTRACT

Optical guide layers are formed on both faces of the active layer, respectively, which optical guide layers have a band gap wider than that of the active layer, an n-type cladding layer and a p-type cladding layer respectively formed so as to sandwich the active layer and the optical guide layers therebetween, which cladding layers have a band gap wider than those of the optical guide layers, and carrier blocking layers are respectively formed between the active layer and the optical guide layers, which carrier blocking layers have a band gap wider than those of the active layer and the optical guide layers. The refractive index of the p-type cladding layer is lower than that of the n-type cladding layer. With such constitution inner losses are limited to a low level, as free carrier absorption is reduced, and the electric and thermal resistances of a semiconductor laser device are reduced, with the result that the laser device is enhanced in efficiency and output power.

2 Claims, 3 Drawing Sheets

SEMICONDUCTOR LASER DEVICE

BACKGROUND OF THE INVENTION

1. Field of the Invention

The present invention relates to a semiconductor laser device capable of operating at high efficiency and high output power, which is preferably used in the fields of communication, printing, laser medical treatment, laser beam machining and the like.

2. Description of the Related Art

For the purpose of enhancing an output power of a semiconductor laser, the applicant of the present application has proposed a semiconductor laser which is provided with carrier blocking layers having a wide band gap and a small thickness on both sides of an active layer, whereby the design freedom of a band gap of a cladding layer formed outside the carrier blocking layer is increased (WO 93/16513).

In such a configuration, the carrier blocking layer has a function of confining an injected carrier in the active layer efficiently and the carrier blocking layer is formed into a thin shape, so that light generated in the active layer can pass through the carrier blocking layer and leak out easily to an optical guide layer which is disposed outside. Therefore, it is possible to avoid catastrophic optical damage which occurs due to a localization of laser light on an emission facet of a semiconductor laser, and raise the breakdown level of a facet, with the result that an operation at high output power can be realized.

In order to fabricate a semiconductor laser device of higher efficiency, it is important to decrease losses, among which an inner loss depends on free carrier absorption to a large extent. In this free carrier absorption, a p-type layer is more involved than an n-type layer. In the case of using GaAs, for example, the free carrier absorption coefficient $\alpha_{fc}$ [cm$^{-1}$] is expressed by formula (1) as shown below (see page 85, "Semiconductor Laser—basis and application—," edited by Ryoichi ITO and Michiharu NAKAMURA):

$$\alpha_{fc}=3\times10^{-18}\cdot n+7\times10^{-18}\cdot p \qquad (1)$$

wherein n denotes the concentration of an n-type carrier and p denotes the concentration of a p-type carrier. It is apparent from formula (1) that the free carrier absorption coefficient afc is proportional to the concentration of carriers and the p-type layer is involved in free carrier absorption twice as much as the n-type layer or more.

In order to fabricate a semiconductor laser device of further higher efficiency and higher output power, it is important to limit the electric resistance and thermal resistance of the device to a low level. When the electric resistance is high, the energy conversion efficiency is decreased due to the generation of Joule's heat and the like. Moreover, since the temperature of the device rises, a threshold current is increased and an output power is decreased due to heat saturation.

SUMMARY OF THE INVENTION

It is an object of the invention to provide a semiconductor laser device of high efficiency, by reducing free carrier absorption so as to limit inner losses to a low level.

It is another object of the invention to provide a semiconductor laser device of high efficiency and high output power, by reducing the electric resistance and the thermal resistance of the device.

The invention provides a semiconductor laser device including a plurality of sequentially formed layers, comprising:

a first cladding layer,
a first optical guide layer,
a first carrier block layer,
an active layer,
a second carrier blocking layer,
a second optical guide layer,
a second cladding layer,
band gaps of the first and second optical guide layers being wider than that of the active layer,
band gaps of the first and second cladding layers being wider than those of the first and second optical guide layers,
band gaps of the first and second carrier blocking layers being wider than those of the first and second optical guide layers,
one of the first and second cladding layers being of p-type, the other being of n-type,
wherein a refractive index of the p-type cladding layer is lower than that of the n-type cladding layer.

According to the invention, the p-type cladding layer is made so as to have a lower refractive index than that of the n-type cladding layer, whereby a wave guide mode will be pushed out to the side of the n-type cladding layer having a higher refractive index. Therefore, it is possible to reduce the distribution amount of light at the p-type cladding layer and the optical guide layer adjacent thereto which are involved in free carrier absorption more than the n-type layers, with the result that the efficiency of the laser device is enhanced with decrease in inner losses.

Further, in the invention it is preferable that a thickness of the p-type cladding layer is smaller than that of the n-type cladding layer.

According to the invention, the p-type cladding layer is thin, whereby the electric resistance of the p-type cladding layer itself is decreased. In general, the electric resistance of a p-type layer is higher than that of an n-type layer, and a cladding layer is likely to be the thickest of all the layers which constitute a semiconductor laser, so that the electric resistance of the p-type cladding layer makes up the largest portion of a total of electric resistance. Therefore, it is possible to largely reduce the total of electric resistance by reducing the electric resistance of the p-type cladding layer. Moreover, since the generation amount of Joule heat is also decreased, the temperature in the overall device is prevented from rising and the energy conversion efficiency is improved. In addition, the maximum output power, which is restricted by heat saturation, is also increased. Accordingly, a semiconductor laser of high efficiency and high output power can be implemented.

Further, the p-type cladding layer is thin, whereby the thermal resistance of the p-type cladding layer itself is also decreased. In a semiconductor laser device in general, respective layers are formed on an n-type substrate, and are usually adhered by junction down in order to enhance an efficiency of heat radiation, so that the layers formed on the side of the p-type layer are adhered on a mount. In a case where the p-type layers are adhered on the mount, heat generated in the active layer escapes to the mount through the p-type layer having a low thermal resistance, with the result that the heat is smoothly radiated and the temperature in the overall device can be prevented from rising.

Still further, the p-type cladding layer is formed into a thin shape, whereby the distance between the top face and the active layer is shortened. Therefore, in the case where a window or stripe structure is embedded by ion implantation or the like, an acceleration voltage on ion implantation is lowered, and damage to the laser device can be reduced. As a result, the semiconductor laser device is enhanced in reliability and output power.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
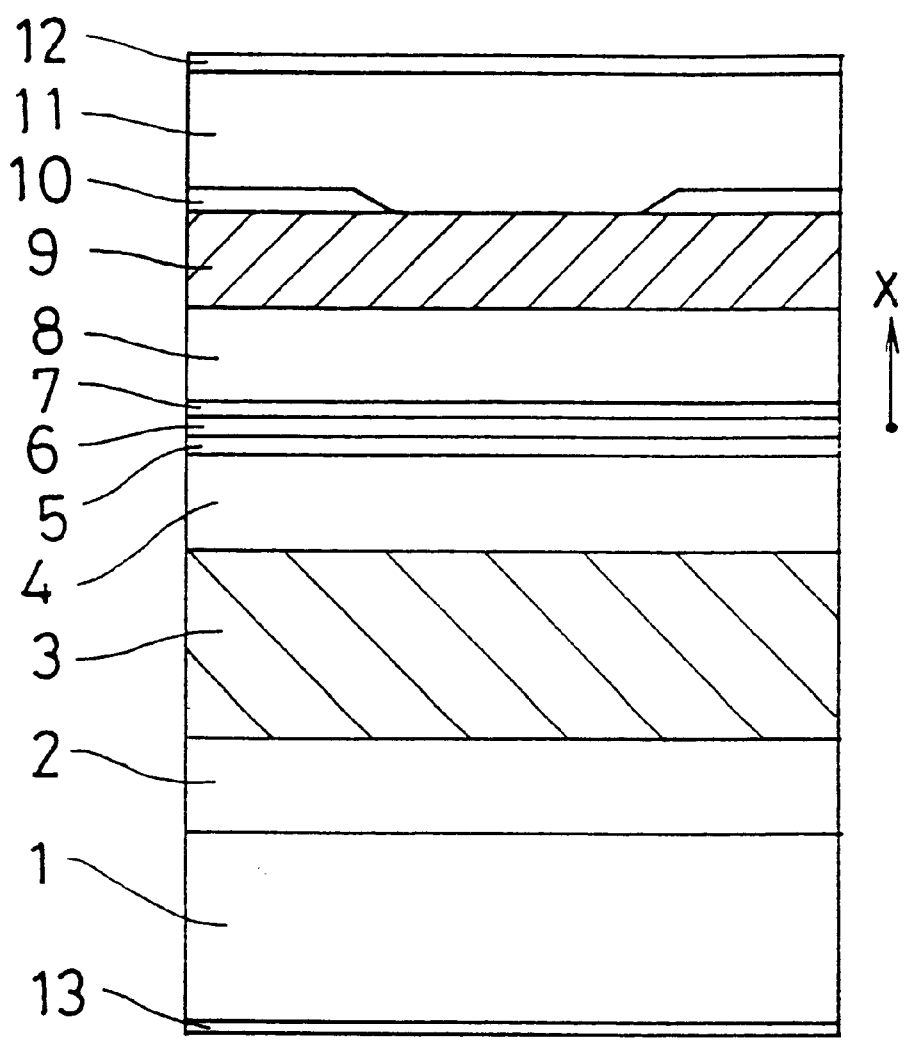
FIG. 1 is a view showing an embodiment of the invention.

Now referring to the drawings, preferred embodiments of the invention are described below.

FIG. 1 is a view showing an embodiment of the invention. In this semiconductor laser device, a buffer layer 2 made of n-GaAs (thickness t=0.5 $\mu$m), an n-type cladding layer 3 made of n-AlGaAs (Al composition ratio x=0.38, refractive index Nn=3.354, t=1.1 $\mu$m), an optical guide layer 4 made of n-AlGaAs (x=0.2, t=0,5 $\mu$m), a carrier blocking layer 5 made of n-AlGaAs (x=0.5, t=0.02 $\mu$m), a double quantum well active layer 6 composed of a non-doped InGaAs well layer (In composition ratio y=0.2, t=0.008 $\mu$m)/a non-doped AlGaAs barrier layer (Al composition ratio x=0.2, t=0.006 $\mu$m), a carrier blocking layer 7 made of p-AlGaAs (x=0.5, t=0.02 $\mu$m), an optical guide layer 8 made of p-AlGaAs (x=0.2, t=0.5 $\mu$m), a p-type cladding layer 9 made of p-AlGaAs (x=0.7, refractive index Np=3.166, t=0.5 $\mu$m), a current blocking layer 10 made of n-GaAs (t=0.3 $\mu$m) having a stripe-like window, and a contact layer 11 made of p-GaAs (t=1 $\mu$m) are sequentially formed on a substrate 1 made of n-GaAs, by using the MOCVD (Metal Organic Chemical Vapor Deposition) method or the like. On the bottom face of the substrate 1 and the top face of the contact layer 11 are formed electrodes 13, 12, respectively.

AlGaAs type materials have a tendency of the band gap to widen with increase in Al composition. In the embodiment, the band gaps of the optical guide layers 4, 8 are wider than that of the active layer 6, the band gaps of the cladding layers 3, 9 are wider than those of the optical guide layers 4, 8, and the band gaps of the carrier blocking layers 5, 7 are wider than those of the optical guide layers 4, 8.

Next, the operation of the semiconductor laser device will be described. When a positive bias voltage is applied to the electrode 12 of the contact layer 11 and a negative bias voltage is applied to the electrode 13 of the substrate 1, an electric current flows from the contact layer 11 to the substrate 1, and passes through only a region where the current blocking layer 10 is not formed, i.e., through the stripe-like window, whereby the electric current density is increased.

The electric current is injected into the active layer 6 as a carrier, and then the carrier re-combines to emit light. Further, as the injection amount of current increases, induced emission starts, and finally laser oscillation starts to occur between facets which construct an optical resonator, in the vertical direction on the sheet of FIG. 1. The laser light is distributed through the optical guide layers 4, 8 and the cladding layers 3, 9 disposed on both faces of the active layer 6, and is then guided. On the other hand, the carrier in the active layer 6 is confined in the active layer due to the existence of the carrier blocking layers 5, 7, so that an improvement in recombination efficiency is attained.

Next, a reference example will be described as a comparative object. A semiconductor laser device of the reference example is formed in accordance with the embodiment of FIG. 1, while the refractive index and thickness of the n-type cladding layer 3 are identical to those of the p-type cladding layer 9, wherein the refractive index is 3.354 and the thickness t is 1.1 $\mu$m.

Figure 2:
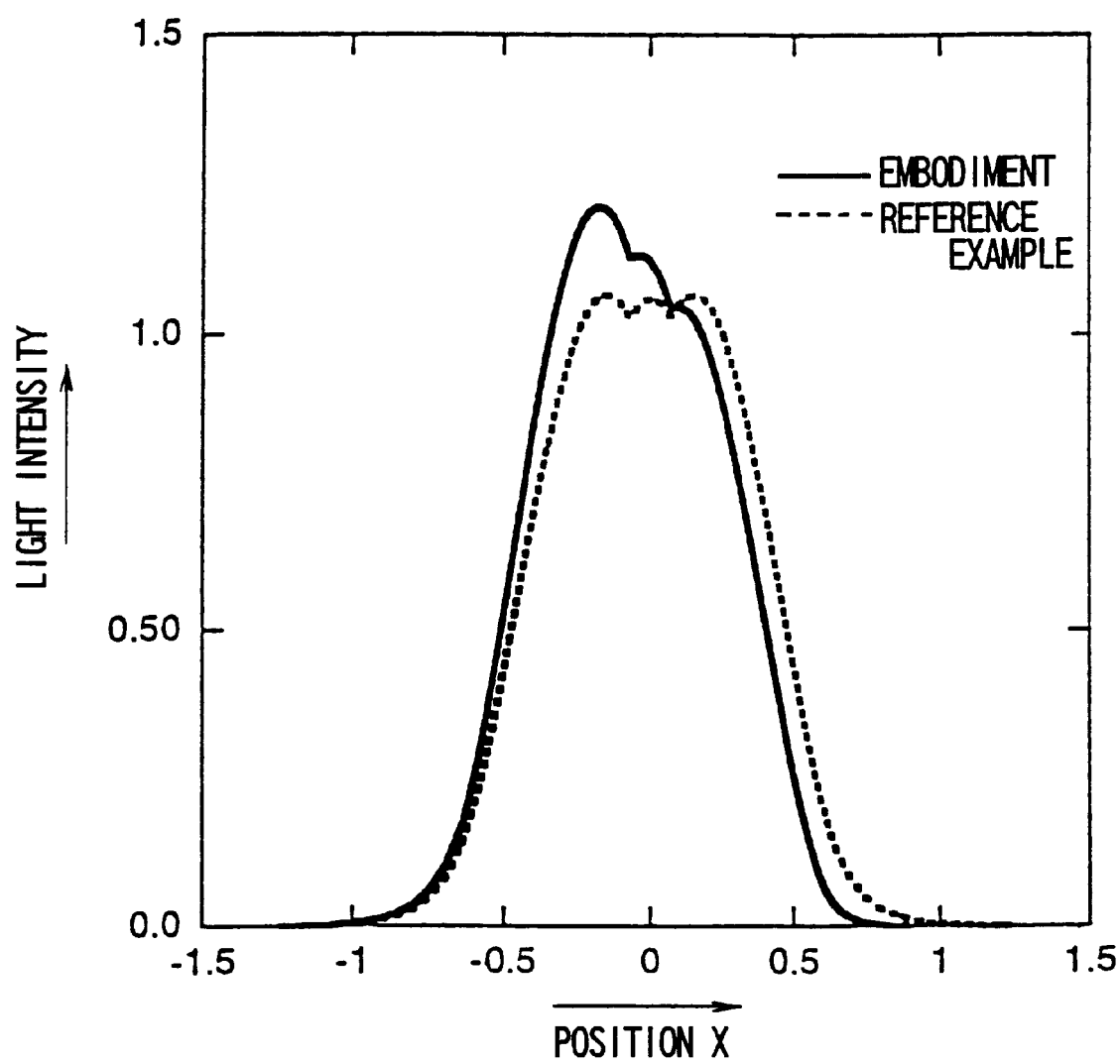
FIG. 2 is a graph showing wave guide modes of the embodiment and a reference example.

FIG. 2 is a graph showing wave guide modes of the embodiment and the reference example. The horizontal axis indicates positions in the direction of layer-thickness with respect to the active layer 6 (unit: $\mu$m), and the vertical axis indicates intensities of light (arbitrary unit, linear). It is apparent from this graph that in the embodiment (shown by a solid line), the p-type cladding layer is formed so as to have a refractive index lower than that of the n-type cladding layer, whereby a wave guide mode of the embodiment is pushed out to the side of the n-type layer (negative side) as a whole, as compared with the reference example (shown by a dotted line). This configuration decreases the distribution amounts of wave guide mode at the p-type guide layer and at the p-type cladding layer, thereby making it possible to decrease inner losses due to free carrier absorption.

The embodiment herein shows a case where both the refractive index and the thickness of the n-type cladding layer 3 are different from those of the p-type cladding layer 9. However, even when the cladding layers have the same thickness and different refractive indices from each other, a wave guide mode will be shown by the same solid line of FIG. 2, and free carrier absorption at the p-type guide layer and the p-type cladding layer can be reduced in the same fashion.

Figure 3:
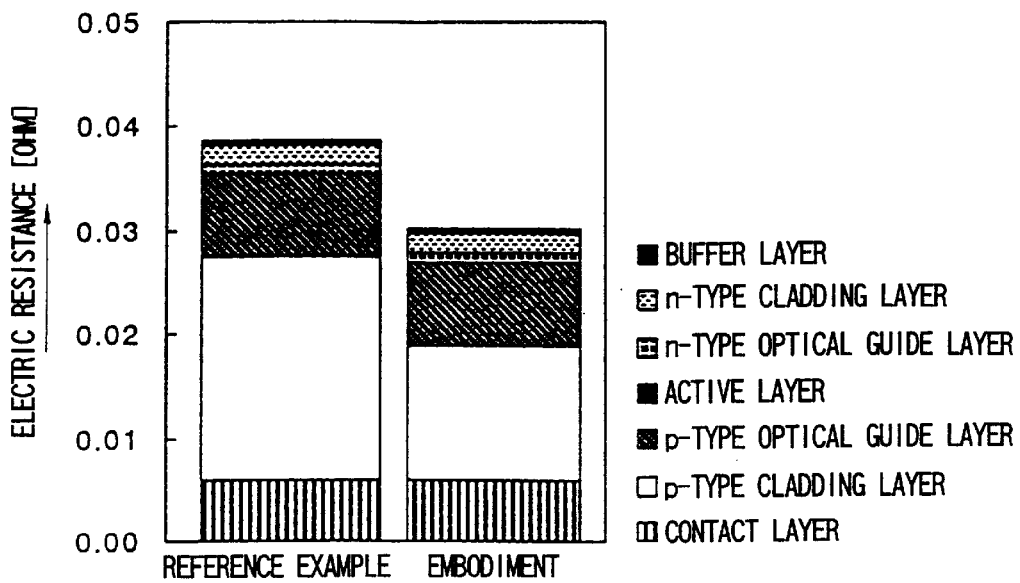
FIG. 3 is a graph showing electric resistances of the embodiment and the reference example.

FIG. 3 is a graph showing the electric resistances of the embodiment and the reference example, wherein the vertical axis indicates the electric resistance ($\Omega$) and the order of layers as shown in FIG. 1 is turned upside down. It is apparent from this graph that among the respective layers constructing a semiconductor laser, the p-type cladding layer has the highest electric resistance. Moreover, it is apparent that in the embodiment, the p-type cladding layer is made so as to have a smaller thickness than that of the n-type cladding layer, whereby the electric resistance of the p-type cladding layer can be decreased to about 60% as compared with the reference example, and the whole electric resistance can be also reduced to a large extent.

Figure 4:
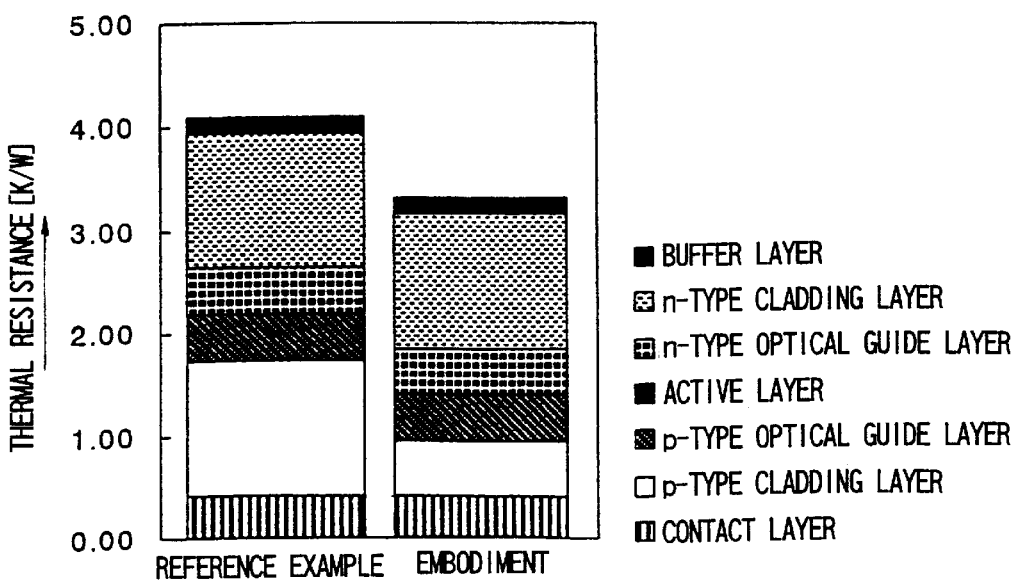
FIG. 4 is a graph showing thermal resistances of the embodiment and the reference example.

FIG. 4 is a graph showing the thermal resistances of the embodiment and the reference example, wherein the vertical axis indicates the thermal resistance (K/W) and the order of layers as shown in FIG. 1 is turned upside down. It is apparent from this graph that among the respective layers constructing a semiconductor laser, the p-type cladding layer and the n-type cladding layer have considerably high thermal resistances. Moreover, it is apparent that in the embodiment, the p-type cladding layer is made so as to have a smaller thickness than that of the n-type cladding layer, whereby the thermal resistance of the p-type cladding layer can be decreased to about 40% as compared with the reference example, and the whole thermal resistance can be also reduced to a large extent. In particular, in a case where a semiconductor laser is mounted by junction down, the embodiment will be advantageous because the thermal resistance on the side of the p-type layer of the active layer is decreased.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor laser device including a plurality of sequentially formed layers, comprising:

a first cladding layer, a first optical guide layer, a first carrier block layer, an active layer, a second carrier blocking layer, a second optical guide layer, a second cladding layer, band gaps of the first and second optical guide layers being wider than that of the active layer, band gaps of the first and second cladding layers being wider than those of the first and second optical guide layers, band gaps of the first and second carrier blocking layers being wider than those of the first and second optical guide layers, one of the first and second cladding layers being of p-type, the other being of n-type, wherein a refractive index of the p-type cladding layer is lower than that of the n-type cladding layer.

2. The semiconductor laser device of claim 1, wherein a thickness of the p-type cladding layer is smaller than that of the n-type cladding layer.

* * * * *